(12) United States Patent
Cho

(10) Patent No.: US 10,797,081 B2
(45) Date of Patent: Oct. 6, 2020

(54) DISPLAY PANEL AND DISPLAY APPARATUS

(71) Applicants: HKC Corporation Limited, Shenzhen (CN); Chongqing HKC Optoelectronics Technology Co.,ltd., Chongqing (CN)

(72) Inventor: En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/338,534

(22) PCT Filed: Aug. 10, 2017

(86) PCT No.: PCT/CN2017/096722
§ 371 (c)(1),
(2) Date: Apr. 1, 2019

(87) PCT Pub. No.: WO2019/006818
PCT Pub. Date: Jan. 10, 2019

(65) Prior Publication Data
US 2020/0035714 A1    Jan. 30, 2020

(30) Foreign Application Priority Data
Jul. 6, 2017 (CN) .......................... 2017 1 0546096

(51) Int. Cl.
*H01L 31/101* (2006.01)
*H01L 21/84* (2006.01)
*H01L 27/12* (2006.01)
*H01L 21/02* (2006.01)
*H01L 29/786* (2006.01)

(52) U.S. Cl.
CPC .... *H01L 27/1222* (2013.01); *H01L 21/02271* (2013.01); *H01L 27/127* (2013.01); *H01L 29/78669* (2013.01)

(58) Field of Classification Search
CPC .................................................. H01L 27/1237
USPC .................................. 438/158, 176; 257/462
See application file for complete search history.

(56) References Cited

U.S. PATENT DOCUMENTS

| | | | | |
|---|---|---|---|---|
| 6,395,586 B1 * | 5/2002 | Huang | ................... | H01L 29/458 257/59 |
| 7,115,433 B2 * | 10/2006 | You | ....................... | G02F 1/1345 438/30 |
| 7,629,189 B2 * | 12/2009 | Lim | .................... | H01L 27/1288 438/34 |

(Continued)

*Primary Examiner* — Calvin Lee
(74) *Attorney, Agent, or Firm* — WPAT, PC

(57) ABSTRACT

The present application discloses a display panel and a display device apparatus. The display panel includes a substrate, the substrate includes a plurality of pixel regions; an active switch, a plurality of active switches disposed on the substrate, wherein the pixel regions are disposed on the active switches, the active switches are corresponding to each of the pixel regions, respectively, and each of the active switch includes: an insulating layer, the insulating layer includes at least two thin film layers, the thin film layers are formed by chemical vapor deposition process with a predetermined thickness.

15 Claims, 3 Drawing Sheets

(56) References Cited

U.S. PATENT DOCUMENTS

| | | | | |
|---|---|---|---|---|
| 7,777,231 B2* | 8/2010 | Gan | ................... | H01L 29/4908 |
| | | | | 257/351 |
| 7,816,194 B2* | 10/2010 | Lu | ................... | H01L 29/66765 |
| | | | | 438/164 |
| 8,421,940 B2* | 4/2013 | Noda | ................... | H01L 27/1229 |
| | | | | 349/42 |
| 9,324,735 B2* | 4/2016 | Cheng | ................... | H01L 27/124 |
| | | | | 257/43 |

* cited by examiner

DISPLAY PANEL AND DISPLAY APPARATUS

FIELD OF THE DISCLOSURE

The present application relates to a display technology field, and more particularly to a display panel and a display apparatus.

BACKGROUND

The existing displays are generally controlled based on an active switch, with the compact body, power saving, no radiation and many other advantages, has been widely used, mainly including liquid crystal display, OLED (Organic Light-Emitting Diode) display, QLED (Quantum Dot Light Emitting Diodes) display, plasma display, etc., from the appearance of view, both flat-type display, but also curve-type display.

For the liquid crystal display, two parts of the liquid crystal panel and backlight module are included, the working principle of the liquid crystal display is placing liquid crystal molecules in two parallel glass substrate, and applying driving voltage to control the direction of rotation of the molecule the liquid crystal between the two glass substrates to reflect the light from the backlight module to produce an image.

For the OLED display, by using of the organic light-emitting diode to self-luminous to perform the display, and having the advantages of the self-luminous, wide viewing angle, almost infinite high contrast, low power consumption, high response speed and so on.

The structure of the QLED display is very similar with the OLED technology, the main difference is that the luminous center of QLED is formed by the quantum dots material composition. Its structure is that both sides of the electrons and holes converge in the quantum dot layer to form excitons, and through the recombination of the excitons to emit light.

However, for the interface of the correlation layer in the active switch, if the use of conventional methods to improve the insulation layer will make the quality of the interface decreased, while the leakage volume of the current leakage also increased, not only the reliability of the active switch worse, but also affect the performance of the normal use of active switch.

SUMMARY

An object of the present application is to provide a display panel which cooperates with active switches.

In order to solve the above-mentioned problems, the display panel provided by the embodiment of the present application includes:

A substrate, including a plurality of pixel regions;

A plurality of active switches disposed on the substrate, wherein the pixel regions are disposed on the active switches, the active switches are corresponding to each of the pixel regions, respectively, and each of the active switch includes: an insulating layer, including at least two thin film layers, the thin film layers are formed by chemical vapor deposition process with a predetermined thickness.

Wherein each of the active switch includes a gate electrode layer disposed at a bottom region, the insulating layer is disposed on the gate electrode layer, the insulating layer includes a first insulating thin film layer and a second insulating thin film layer, the first insulating thin film layer and the second insulating thin film layer are arranged successively, the first insulating thin film layer is disposed in a terminal away from the gate electrode layer, and the second insulating thin film layer is disposed in another terminal close to the gate electrode layer; and wherein a thickness of the insulating layer is 3500 to 4000 Ångstrom, a thickness of the first insulating thin film layer is 500 to 2000 Ångstrom, and a thickness of the second insulating thin film layer is 2000 to 3500 Ångstrom. Here is the case where the insulating layer is provided with two thin film layers, and the arrangement of the thickness of the insulating layer corresponding to each of the thin film layers.

Wherein each of the active switch includes a gate electrode layer disposed at a bottom region, the insulating layer includes a first insulating thin film layer, a second insulating thin film layer, a third insulating thin film layer, the first insulating thin film layer, the second insulating thin film layer and the third insulating thin film layer are arranged successively, the first insulating thin film layer is disposed in a terminal away from the gate electrode layer, and the third insulating thin film layer is disposed in another terminal close to the gate electrode layer; and wherein a thickness of the insulating layer is 3500 to 4000 Ångstrom, a thickness of the first insulating thin film layer is 500 to 2000 Ångstrom, a thickness of the second insulating thin film layer is 1000 to 3000 Ångstrom, a thickness of the third insulating thin film layer is 500 to 2000 Ångstrom. Here is the case where the insulating layer is provided with three thin film layers, and the arrangement of the thickness of the insulating layer corresponding to each of the thin film layers. The arrangement of the three thin film layers can better improve the quality of the interface between the insulating layer and the amorphous silicon layer and the uniformity of the insulating layer.

Wherein an amorphous silicon layer is disposed on the insulating layer, the amorphous silicon layer includes two thin film layers: a first amorphous silicon thin film layer and a second amorphous silicon thin film layer, the first amorphous silicon thin film layer and the second amorphous silicon thin film layer are arranged successively, the first amorphous silicon thin film layer is disposed in a terminal away from the insulating layer, the second amorphous silicon thin film layer is disposed in another terminal close to the insulating layer; and wherein a thickness of the first amorphous silicon thin film layer is 1000 Ångstrom, and a thickness of the second amorphous silicon thin film layer is 300 Ångstrom. Here is the case where the amorphous silicon layer is provided with two layers, and the arrangement of the thickness of the amorphous silicon layer corresponding to each of the thin film layers. With the disposing of the insulating layer can further improve the quality of the interface, to improve the uniformity of the amorphous silicon layer, and faster the processing rate of the chemical vapor deposition for thin film deposition.

Wherein when performing the chemical vapor deposition, a silicon tetrafluoride, an ammonia and a nitrogen for the first insulating thin film layer are 2300 to 2530 milliliters per minute in standard condition, 15000 to 16000 milliliters per minute in standard condition, and 68000 to 83500 milliliters per minute in standard condition, respectively;

The silicon tetrafluoride, the ammonia and the nitrogen for the second insulating thin film layer are 5500 milliliters per minute in standard condition, 30000 milliliters per minute in standard condition, and 80000 milliliters per minute in standard condition, respectively;

The silicon tetrafluoride, the ammonia and the nitrogen for the third insulating thin film layer are 7000 to 7200 milliliters per minute in standard condition, 26000 to 27000 milliliters per minute in standard condition, and 66000 to 70000 milliliters per minute in standard condition, respectively. Here is the gas volume flow rate of the thin film deposition by the case of the insulating layer is provided with three layers, to ensure the formation of the normal function of the insulating layer.

Wherein a pressure applied to the first insulating thin film layer is 1200 to 1400 mTorr, the pressure applied to the second insulating thin film layer is 1550 mTorr, and the pressure applied to the third insulating thin film layer is 1400 to 1500 mTorr. Here is the pressure setting required for each film to be deposited in the case of a three thin film layers of the insulation layer.

Wherein the thin film layers of the insulating layer are formed by the chemical vapor deposition at a preset temperature, the temperature adapted being 340° C. or 360° C. Here is the temperature setting required in the case of a three thin film layers of the insulation layer.

Wherein the amorphous silicon layer includes an ohmic contact layer disposed corresponding to the amorphous silicon layer, two terminals of the ohmic contact layer are provided with a separated source electrode layer and a drain electrode layer of each of the active switch, a channel is provided between the source electrode layer and the drain electrode layer, the channel passes through the ohmic contact layer, and a bottom of the channel is the amorphous silicon layer. Here is the specific disposition of each layer of the active switch.

Another object of the present application is to provide a display panel cooperating with active switches.

A display panel, including

A substrate, including a plurality of pixel regions;

A plurality of active switches disposed on the substrate, wherein the pixel regions are disposed on the active switches, the active switches are corresponding to each of the pixel regions, respectively, and each of the active switch includes: an insulating layer, including at least two thin film layers, the thin film layers are formed by chemical vapor deposition process with a predetermined thickness;

Each of the active switch including a gate electrode layer disposed at a bottom region, the insulating layer including a first insulating thin film layer, a second insulating thin film layer, a third insulating thin film layer, the first insulating thin film layer, the second insulating thin film layer and the third insulating thin film layer arranged successively, the first insulating thin film layer disposed in a terminal away from the gate electrode layer, the third insulating thin film layer disposed in another terminal close to the gate electrode layer;

Wherein a thickness of the insulating layer is 3500 to 4000 Ångstrom, the thickness of the first insulating thin film layer is 500 to 2000 Ångstrom, the thickness of the second insulating thin film layer is 1000 to 3000 Ångstrom, the thickness of the third insulating thin film layer is 500 to 2000 Ångstrom;

An amorphous silicon layer disposed on the insulating layer, the amorphous silicon layer including two thin film layers: a first amorphous silicon thin film layer and a second amorphous silicon thin film layer, the first amorphous silicon thin film layer and the second amorphous silicon thin film layer arranged successively, the first amorphous silicon thin film layer disposed in a terminal away from the insulating layer, the second amorphous silicon thin film layer disposed in another terminal close to the insulating layer;

Wherein a thickness of the first amorphous silicon thin film layer is 1000 Ångstrom, and a thickness of the second amorphous silicon thin film layer is 300 Ångstrom;

Wherein when performing the chemical vapor deposition, a silicon tetrafluoride, an ammonia and a nitrogen for the first insulating thin film layer are 2300 to 2530 milliliters per minute in standard condition, 15000 to 16000 milliliters per minute in standard condition, and 68000 to 83500 milliliters per minute in standard condition, respectively, the silicon tetrafluoride, the ammonia and the nitrogen for the second insulating thin film layer are 5500 milliliters per minute in standard condition, 30000 milliliters per minute in standard condition, and 80000 milliliters per minute in standard condition, respectively, the silicon tetrafluoride, the ammonia and the nitrogen for the third insulating thin film layer are 7000 to 7200 milliliters per minute in standard condition, 26000 to 27000 milliliters per minute in standard condition, and 66000 to 70000 milliliters per minute in standard condition, respectively;

Wherein a pressure applied to the first insulating thin film layer is 1200 to 1400 mTorr, the pressure applied to the second insulating thin film layer is 1550 mTorr, and the pressure applied to the third insulating thin film layer is 1400 to 1500 mTorr; and The thin film layers of the insulating layer formed by the chemical vapor deposition at a preset temperature, the temperature adapted being 340° C. or 360° C.

Another object of the present application is to provide a display apparatus cooperating with active switches.

A display apparatus, including: a control element; and a display panel provided in the present application.

By providing at least two thin film layers of the insulating layer, the film is formed with a predetermined thickness and in a predetermined deposition rate by chemical vapor deposition, and the formation of the insulating layer by chemical vapor deposition is more uniform, while improving the quality of the interface between the insulating layer and the amorphous silicon layer, the reliability of the active switch, and the deposition rate of chemical vapor deposition.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
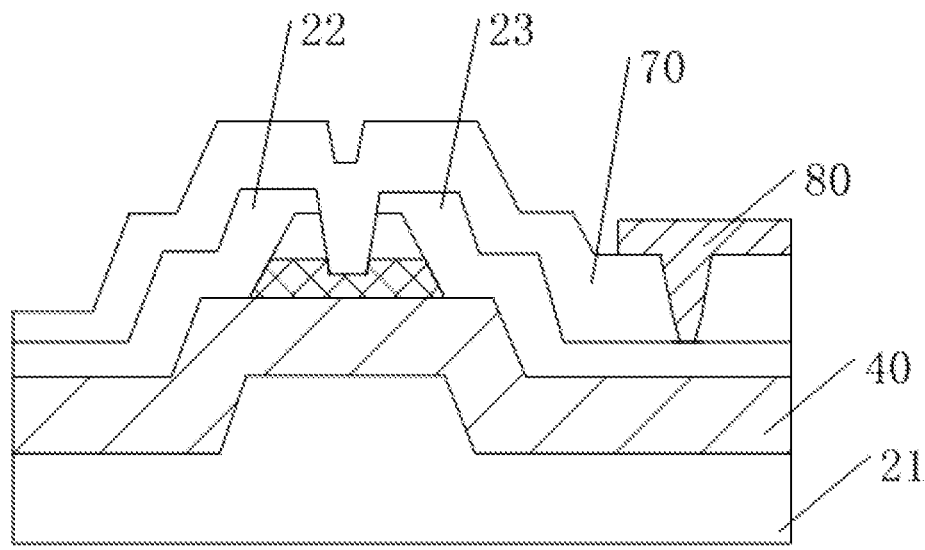
FIG. 1 is a schematic illustration of an active switch in a display panel of an embodiment of the present application.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

In the following, structures of display panels associated with the disclosure will be described with reference to FIG. 1 through FIG. 5.

Figure 2:
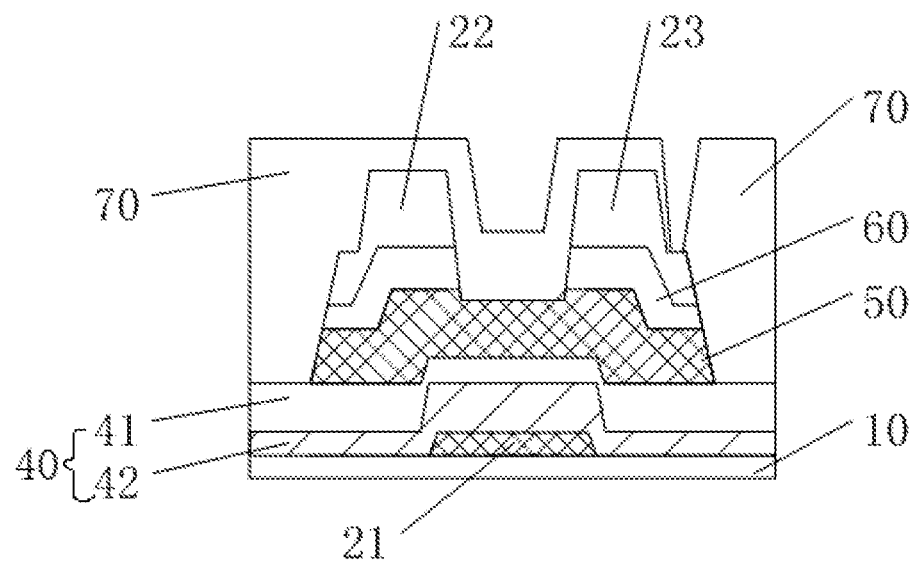
FIG. 2 is a schematic illustration of deposition layers of an insulating layer the display panel of an embodiment of the present application.

As an embodiment of the present application, as shown in FIGS. 1-2, the display panel includes: a substrate 10, the substrate 10 is provided with a plurality of pixel regions; an active switch, a plurality of the active switches is disposed on the substrate 10, the pixel region is disposed on the active switch, the active switch is corresponding to the pixel region, the active switch including: an insulating layer 40, the insulating layer 40 includes at least two thin film layers, the thin film is formed by chemical vapor deposition process with a predetermined thickness. By providing at least two thin film layers of the insulating layer 40, the film is formed with a predetermined thickness and in a predetermined deposition rate by chemical vapor deposition, and the formation of the insulating layer 40 by chemical vapor deposition is more uniform, while improving the quality of the interface between the insulating layer 40 and the amorphous silicon layer 50, the reliability of the active switch, and the deposition rate of chemical vapor deposition.

Wherein, chemical vapor deposition, CVD method is a gas phase reaction at high temperature, and is developed as a means of coating, but not only applied to the coating of heat-resistant substances, and applied to high purity metal refining, powder synthesis, and semiconductor thin film, and the like. The deposition temperature is low, the composition of the thin film is easy to control, the film thickness is proportional to the deposition time, with well uniformity and the repeatability, and the step coverage is excellent. The technical characteristics of the chemical vapor deposition method are that the substance with high melting point can be synthesized at low temperature; the morphology of the precipitated material is in the form of single crystal, polycrystalline, whisker, powder, thin film and so on; not only can the coating be carried out on the substrate, and coating layers on the surface of the powder and so on. Especially, the material with high melting point can be synthesized at low temperatures, made a contribution in energy conservation, as a new technology is promising.

Figure 3:
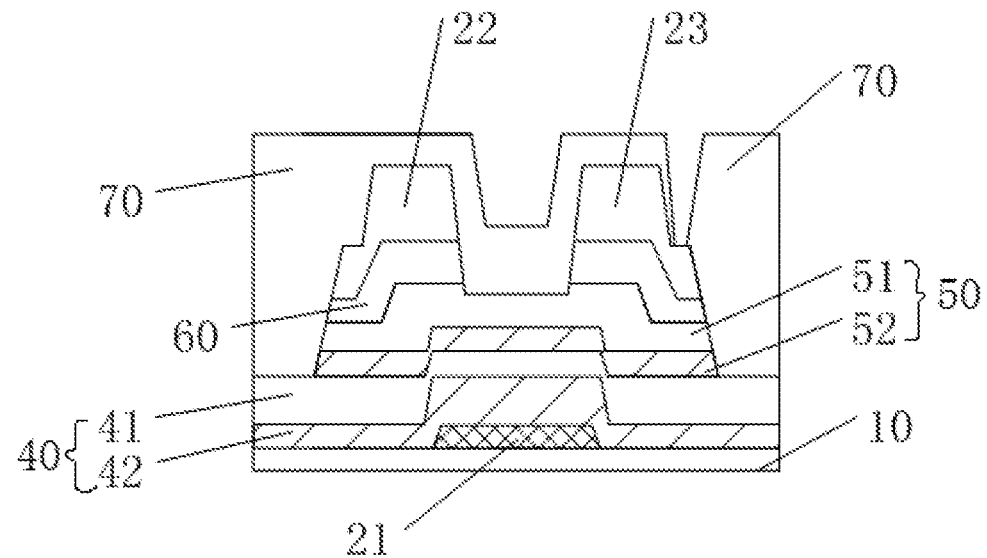
FIG. 3 is a schematic view showing a structure of the thin film deposition of the separating two layers of the insulating layer and the two layers of the amorphous silicon layer in the display panel of an embodiment of the present application.

As a further embodiment of the present application, as shown in FIGS. 2-3, the display panel includes a substrate 10, the substrate 10 is provided with a plurality of pixel regions; an active switch, a plurality of active switches is disposed on the substrate 10, wherein the pixel region is disposed on the active switch, the active switch is corresponding to the pixel region, the active switch including: an insulating layer 40, the insulating layer 40 includes at least two thin film layers, the thin film is formed by chemical vapor deposition process with a predetermined thickness. By providing at least two thin film layers of the insulating layer 40, the film is formed with a predetermined thickness and in a predetermined deposition rate by chemical vapor deposition, and the formation of the insulating layer 40 by chemical vapor deposition is more uniform, while improving the quality of the interface between the insulating layer 40 and the amorphous silicon layer 50, the reliability of the active switch, and the deposition rate of chemical vapor deposition. The active switch includes a gate electrode layer 21 disposed at the bottom, the gate electrode layer 21 includes the insulating layer 40, the insulating layer 40 includes the amorphous silicon layer 50, the amorphous silicon layer 50 includes an ohmic contact layer 60 corresponding to the amorphous silicon layer 50, and the two terminals of the ohmic contact layer 60 is provided with a source electrode layer 22 and a drain electrode layer 23 to divide the active switch, a channel is provided between the source electrode layer 22 and the drain electrode layer 23, and the channel passes through the ohmic contact layer 60, and the bottom of the channel is the amorphous silicon layer 50. The insulating layer 40 includes a first insulating thin film layer 41, and a second insulating thin film layer 42, the first insulating thin film layer 41 and the second insulating thin film layer 42 are arranged successively from one terminal away from the gate electrode layer 21 to the terminal close to the gate electrode layer 21, the thickness of the insulating layer 40 is 3500 to 4000 Ångstrom, the thickness of the first insulating thin film layer 41 is 500 to 2000 Ångstrom, and the thickness of the second insulating thin film layer 42 is 2000 to 3500 Ångstrom.

Figure 4:
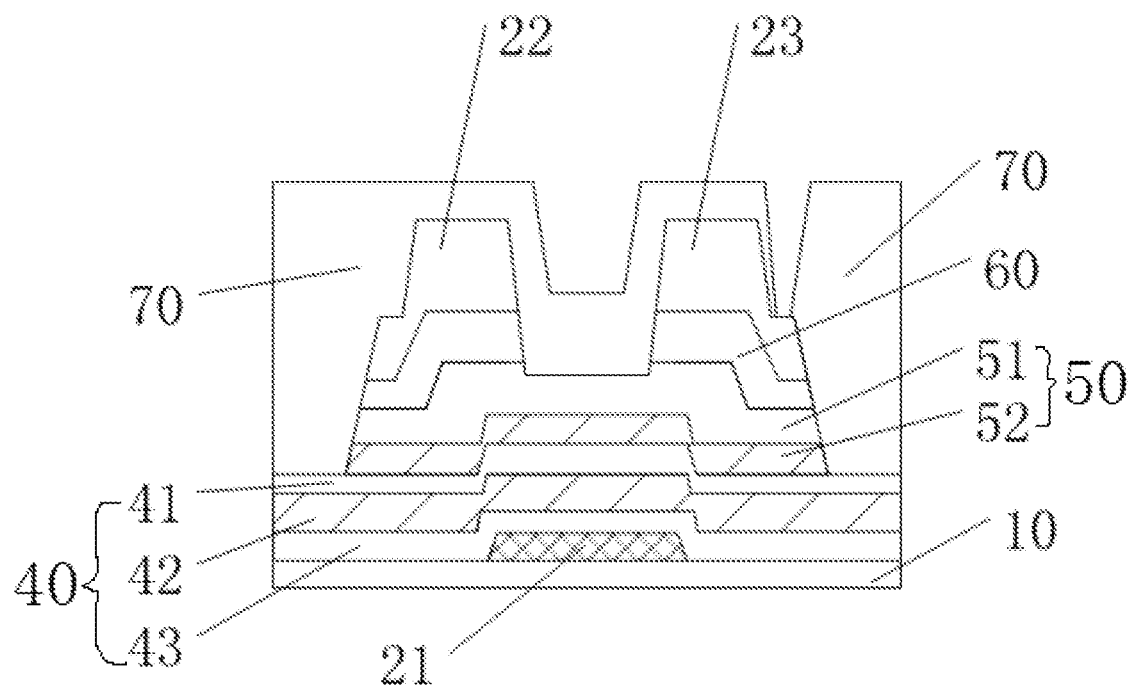
FIG. 4 is a schematic view showing a structure of the thin film deposition of the separating three layers of the insulating layer and the two layers of the amorphous silicon layer in the display panel of an embodiment of the present application.

As a further embodiment of the present application, as shown in FIG. 4, the display panel includes a substrate 10, the substrate 10 is provided with a plurality of pixel regions; an active switch, a plurality of active switches is disposed on the substrate 10, wherein the pixel region is disposed on the active switch, the active switch is corresponding to the pixel region, the active switch including: an insulating layer 40, the insulating layer 40 includes at least two thin film layers, the thin film is formed by chemical vapor deposition process with a predetermined thickness. By providing at least two thin film layers of the insulating layer 40, the film is formed with a predetermined thickness and in a predetermined deposition rate by chemical vapor deposition, and the formation of the insulating layer 40 by chemical vapor deposition is more uniform, while improving the quality of the interface between the insulating layer 40 and the amorphous silicon layer 50, the reliability of the active switch, and the deposition rate of chemical vapor deposition. The active switch includes a gate electrode layer 21 disposed at the bottom, the gate electrode layer 21 includes the insulating layer 40, the insulating layer 40 includes the amorphous silicon layer 50, the amorphous silicon layer 50 includes an ohmic contact layer 60 corresponding to the amorphous silicon layer 50, and the two terminals of the ohmic contact layer 60 is provided with a source electrode layer 22 and a drain electrode layer 23 to divide the active switch, a channel is provided between the source electrode layer 22 and the drain electrode layer 23, and the channel passes through the ohmic contact layer 60, and the bottom of the channel is the amorphous silicon layer 50. The insulating layer 40 includes a first insulating thin film layer 41, a second insulating thin film layer 42, and a third insulating thin film layer 43. The first insulating thin film layer 41, the second insulating thin film layer 42 and the third insulating thin film layer 43 are arranged successively from one terminal away from the gate electrode layer 21 to the terminal close to the gate electrode layer 21, the thickness of the insulating layer 40 is 3500 to 4000 Ångstrom, the thickness of the first insulating thin film layer 41 is 500 to 2000 Ångstrom, the thickness of the second insulating thin film layer 42 is 1000 to 3000 Ångstrom and the thickness of the third insulating thin film layer 43 is 500 to 2000 Ångstrom. The arrangement of the three-layer thin films can better improve the quality of the interface between the insulating layer 40 and the amorphous silicon layer 50 and the uniformity of the insulating layer 40.

As a further embodiment of the present application, as shown in FIG. 3, the display panel includes the substrate 10, the substrate 10 is provided with the plurality of pixel regions; the active switch, the plurality of active switches is disposed on the substrate 10, wherein the pixel region is disposed on the active switch, the active switch is corresponding to the pixel region, the active switch including: the insulating layer 40, the insulating layer 40 includes at least two thin film layers, the thin film is formed by chemical vapor deposition process with a predetermined thickness. By providing at least two thin film layers of the insulating layer 40, the film is formed with a predetermined thickness and in a predetermined deposition rate by chemical vapor deposition, and the formation of the insulating layer 40 by chemical vapor deposition is more uniform, while improving the quality of the interface between the insulating layer 40 and the amorphous silicon layer 50, the reliability of the active switch, and the deposition rate of chemical vapor deposition. The active switch includes the gate electrode layer 21 disposed at the bottom, the gate electrode layer 21 includes the insulating layer 40, the insulating layer 40 includes the amorphous silicon layer 50, the amorphous silicon layer 50 includes the ohmic contact layer 60 corresponding to the amorphous silicon layer 50, and the two terminals of the ohmic contact layer 60 is provided with the source electrode layer 22 and the drain electrode layer 23 to divide the active switch, the channel is provided between the source electrode layer 22 and the drain electrode layer 23, and the channel passes through the ohmic contact layer 60, and the bottom of the channel is the amorphous silicon layer 50. The insulating layer 40 includes the first insulating thin film layer 41, and the second insulating thin film layer 42, the first insulating thin film layer 41 and the second insulating thin film layer 42 are arranged successively from one terminal away from the gate electrode layer 21 to the terminal close to the gate electrode layer 21, the thickness of the insulating layer 40 is 3500 to 4000 Ångstrom, the thickness of the first insulating thin film layer 41 is 500 to 2000 Ångstrom, and the thickness of the second insulating thin film layer 42 is 2000 to 3500 Ångstrom. The amorphous silicon layer 50 includes two thin film layers: a first amorphous silicon thin film layer 51 and a second amorphous silicon thin film layer 52, the first amorphous silicon thin film layer 51 and the second amorphous silicon thin film layer 52 are arranged successively from one terminal away from the insulating layer 40 to the terminal close to the insulating layer 40, the thickness of the first amorphous silicon thin film layer 51 is 1000 Ångstrom, and the thickness of the second amorphous silicon thin film layer 52 is 300 Ångstrom. The arrangement corresponding to the insulating layer 40 can improve the quality of the interface, enhances the uniformity of the amorphous silicon layer 50, and is faster the processing rate of the chemical vapor deposition for thin film deposition.

As a further embodiment of the present application, as shown in FIG. 4, the display panel includes a substrate 10, the substrate 10 is provided with a plurality of pixel regions; an active switch, a plurality of active switches is disposed on the substrate 10, wherein the pixel region is disposed on the active switch, the active switch is corresponding to the pixel region, the active switch including: an insulating layer 40, the insulating layer 40 includes at least two thin film layers, the thin film is formed by chemical vapor deposition process with a predetermined thickness. By providing at least two thin film layers of the insulating layer 40, the film is formed with a predetermined thickness and in a predetermined deposition rate by chemical vapor deposition, and the formation of the insulating layer 40 by chemical vapor deposition is more uniform, while improving the quality of the interface between the insulating layer 40 and the amorphous silicon layer 50, the reliability of the active switch, and the deposition rate of chemical vapor deposition. The active switch includes a gate electrode layer 21 disposed at the bottom, the gate electrode layer 21 includes the insulating layer 40, the insulating layer 40 includes the amorphous silicon layer 50, the amorphous silicon layer 50 includes an ohmic contact layer 60 corresponding to the amorphous silicon layer 50, and the two terminals of the ohmic contact layer 60 is provided with a source electrode layer 22 and a drain electrode layer 23 to divide the active switch, a channel is provided between the source electrode layer 22 and the drain electrode layer 23, and the channel passes through the ohmic contact layer 60, and the bottom of the channel is the amorphous silicon layer 50. The insulating layer 40 includes a first insulating thin film layer 41, a second insulating thin film layer 42, and a third insulating thin film layer 43. The first insulating thin film layer 41, the second insulating thin film layer 42 and the third insulating thin film layer 43 are arranged successively from one terminal away from the gate electrode layer 21 to the terminal close to the gate electrode layer 21, the thickness of the insulating layer 40 is 3500 to 4000 Ångstrom, the thickness of the first insulating thin film layer 41 is 500 to 2000 Ångstrom, the thickness of the second insulating thin film layer 42 is 1000 to 3000 Ångstrom and the thickness of the third insulating thin film layer 43 is 500 to 2000 Ångstrom. The arrangement of the three-layer thin films can better improve the quality of the interface between the insulating layer 40 and the amorphous silicon layer 50 and the uniformity of the insulating layer 40. The amorphous silicon layer 50 includes two thin film layers: a first amorphous silicon thin film layer 51 and a second amorphous silicon thin film layer 52, the first amorphous silicon thin film layer 51 and the second amorphous silicon thin film layer 52 are arranged successively from one terminal away from the insulating layer 40 to the terminal close to the insulating layer 40, the thickness of the first amorphous silicon thin film layer 51 is 1000 Ångstrom, and the thickness of the second amorphous silicon thin film layer 52 is 300 Ångstrom. The arrangement corresponding to the insulating layer 40 can improve the quality of the interface, enhances the uniformity of the amorphous silicon layer 50, and is faster the processing rate of the chemical vapor deposition for thin film deposition.

Wherein, the thickness of the insulating layer 40 can be 4000 Ångstrom, the thickness of the first insulating thin film layer 41 of the insulating layer is 1000 Ångstrom, the thickness of the second insulating thin film layer 42 of the insulating layer is 1000 Ångstrom, and the thickness of the third insulating thin film layer 43 of the insulating layer is 2000 Ångstrom. The thickness of the first amorphous silicon thin film layer 51 is 1000 Ångstrom, the thickness of the second amorphous silicon thin film layer 52 is 300 Ångstrom. The thickness of the ohmic contact layer 60 is 400 Ångstrom.

As a further embodiment of the present application, as shown in FIG. 4, the display panel includes a substrate 10, the substrate 10 is provided with a plurality of pixel regions; an active switch, a plurality of active switches is disposed on the substrate 10, wherein the pixel region is disposed on the active switch, the active switch is corresponding to the pixel region, the active switch including: an insulating layer 40, the insulating layer 40 includes at least two thin film layers, the thin film is formed by chemical vapor deposition process with a predetermined thickness. The thin film transistor includes an insulating layer 40, the insulating layer 40 including at least two thin films, the thin films formed by chemical vapor deposition in a predetermined thickness. By providing at least two thin film layers of the insulating layer 40, the film is formed with a predetermined thickness and in a predetermined deposition rate by chemical vapor deposition, and the formation of the insulating layer 40 by chemical vapor deposition is more uniform, while improving the quality of the interface between the insulating layer 40 and the amorphous silicon layer 50, the reliability of the thin film transistor, and the deposition rate of chemical vapor deposition. The thin film transistor includes a gate electrode layer 21 disposed at the bottom, the gate electrode layer 21 includes the insulating layer 40, the insulating layer 40 includes the amorphous silicon layer 50, the amorphous silicon layer 50 includes an ohmic contact layer 60 corresponding to the amorphous silicon layer 50, and the two terminals of the ohmic contact layer 60 is provided with a source electrode layer 22 and a drain electrode layer 23 to divide the thin film transistor, a channel is provided between the source electrode layer 22 and the drain electrode layer 23, and the channel passes through the ohmic contact layer 60, and the bottom of the channel is the amorphous silicon layer 50. The insulating layer 40 includes a first insulating thin film layer 41, a second insulating thin film layer 42, and a third insulating thin film layer 43. The first insulating thin film layer 41, the second insulating thin film layer 42 and the third insulating thin film layer 43 are arranged successively from one terminal away from the gate electrode layer 21 to the terminal close to the gate electrode layer 21, the thickness of the insulating layer 40 is 3500 to 4000 Ångstrom, the thickness of the first insulating thin film layer 41 is 500 to 2000 Ångstrom, the thickness of the second insulating thin film layer 42 is 1000 to 3000 Ångstrom and the thickness of the third insulating thin film layer 43 is 500 to 2000 Ångstrom. The arrangement of the three-layer thin films can better improve the quality of the interface between the insulating layer 40 and the amorphous silicon layer 50 and the uniformity of the insulating layer 40. The amorphous silicon layer 50 includes two thin film layers: a first amorphous silicon thin film layer 51 and a second amorphous silicon thin film layer 52, the first amorphous silicon thin film layer 51 and the second amorphous silicon thin film layer 52 are arranged successively from one terminal away from the insulating layer 40 to the terminal close to the insulating layer 40, the thickness of the first amorphous silicon thin film layer 51 is 1000 Ångstrom, and the thickness of the second amorphous silicon thin film layer 52 is 300 Ångstrom. The arrangement corresponding to the insulating layer 40 can improve the quality of the interface, enhances the uniformity of the amorphous silicon layer 50, and is faster the processing rate of the chemical vapor deposition for thin film deposition.

Specifically, when the chemical vapor deposition is carried out, the silicon tetrafluoride, the ammonia and the nitrogen for the first insulating thin film layer 41 are 2300 to 2530 milliliters per minute in standard condition, 15000 to 16000 milliliters per minute in standard condition, and 68000 to 83500 milliliters per minute in standard condition, respectively. The silicon tetrafluoride, the ammonia and the nitrogen for the second insulating thin film layer 42 are 5500 milliliters per minute in standard condition, 30000 milliliters per minute in standard condition, and 80000 milliliters per minute in standard condition, respectively.

The silicon tetrafluoride, the ammonia and the nitrogen for the third insulating thin film layer 43 are 7000 to 7200 milliliters per minute in standard condition, 26000 to 27000 milliliters per minute in standard condition, and 66000 to 70000 milliliters per minute in standard condition, respectively. The pressure applied to the first insulating thin film layer 41 is 1200 to 1400 mTorr, the pressure applied to the second insulating thin film layer 42 is 1550 mTorr, and the pressure applied to the third insulating thin film layer 43 is 1400 to 1500 mTorr. The thin film is formed by chemical vapor deposition at a preset temperature of 340° C. or 360° C.

Wherein, the thickness of the insulating layer 40 can be 4500 Ångstrom, the thickness of the first insulating thin film layer 41 is 500 Ångstrom, the thickness of the second insulating thin film layer 42 is 2000 Ångstrom, and the thickness of the third insulating thin film layer 43 is 2000 Ångstrom. The thickness of the first amorphous silicon thin film layer 51 is 1000 Ångstrom, the thickness of the second amorphous silicon thin film layer 52 is 300 Ångstrom. When the chemical vapor deposition is carried out, the silicon tetrafluoride, the ammonia and the nitrogen for the first insulating thin film layer 41 are 2300 milliliters per minute in standard condition, 16000 milliliters per minute in standard condition, and 70000 milliliters per minute in standard condition, respectively. The silicon tetrafluoride, the ammonia and the nitrogen for the second insulating thin film layer 42 are 5500 milliliters per minute in standard condition, 30000 milliliters per minute in standard condition, and 80000 milliliters per minute in standard condition, respectively. The silicon tetrafluoride, the ammonia and the nitrogen for the third insulating thin film layer 43 are 7000 milliliters per minute in standard condition, 27000 milliliters per minute in standard condition, and 70000 milliliters per minute in standard condition, respectively. The pressure applied to the first insulating thin film layer 41 is 1200 mTorr, the pressure applied to the second insulating thin film layer 42 is 1550 mTorr, and the pressure applied to the third insulating thin film layer 43 is 1500 mTorr. The thin film is formed by chemical vapor deposition at a preset temperature of 340° C. or 360° C.

As a further embodiment of the present application, as shown in FIG. 4, the display panel includes a substrate 10, the substrate 10 is provided with a plurality of pixel regions; an active switch, a plurality of active switches is disposed on the substrate 10, wherein the pixel region is disposed on the active switch, the active switch is corresponding to the pixel region, the active switch including: an insulating layer 40, the insulating layer 40 includes at least two thin film layers, the thin film is formed by chemical vapor deposition process with a predetermined thickness. By providing at least two thin film layers of the insulating layer 40, the film is formed with a predetermined thickness and in a predetermined deposition rate by chemical vapor deposition, and the formation of the insulating layer 40 by chemical vapor deposition is more uniform, while improving the quality of the interface between the insulating layer 40 and the amorphous silicon layer 50, the reliability of the active switch, and the deposition rate of chemical vapor deposition. The active switch includes a gate electrode layer 21 disposed at the bottom, the gate electrode layer 21 includes the insulating layer 40, the insulating layer 40 includes the amorphous silicon layer 50, the amorphous silicon layer 50 includes an ohmic contact layer 60 corresponding to the amorphous silicon layer 50, and the two terminals of the ohmic contact layer 60 is provided with a source electrode layer 22 and a drain electrode layer 23 to divide the active switch, a channel is provided between the source electrode layer 22 and the drain electrode layer 23, and the channel passes through the ohmic contact layer 60, and the bottom of the channel is the amorphous silicon layer 50. The insulating layer 40 includes a first insulating thin film layer 41, a second insulating thin film layer 42, and a third insulating thin film layer 43. The first insulating thin film layer 41, the second insulating thin film layer 42 and the third insulating thin film layer 43 are arranged successively from one terminal away from the gate electrode layer 21 to the terminal close to the gate electrode layer 21, the thickness of the insulating layer 40 is 3500 to 4000 Ångstrom, the thickness of the first insulating thin film layer 41 is 500 to 2000 Ångstrom, the thickness of the second insulating thin film layer 42 is 1000 to 3000 Ångstrom and the thickness of the third insulating thin film layer 43 is 500 to 2000 Ångstrom. The arrangement of the three-layer thin films can better improve the quality of the interface between the insulating layer 40 and the amorphous silicon layer 50 and the uniformity of the insulating layer 40. The amorphous silicon layer 50 includes two thin film layers: a first amorphous silicon thin film layer 51 and a second amorphous silicon thin film layer 52, the first amorphous silicon thin film layer 51 and the second amorphous silicon thin film layer 52 are arranged successively from one terminal away from the insulating layer 40 to the terminal close to the insulating layer 40, the thickness of the first amorphous silicon thin film layer 51 is 1000 Ångstrom, and the thickness of the second amorphous silicon thin film layer 52 is 300 Ångstrom. The arrangement corresponding to the insulating layer 40 can improve the quality of the interface, enhances the uniformity of the amorphous silicon layer 50, and is faster the processing rate of the chemical vapor deposition for thin film deposition.

Specifically, when the chemical vapor deposition is carried out, the silicon tetrafluoride, the ammonia and the nitrogen for the first insulating thin film layer 41 are 2300 to 2530 milliliters per minute in standard condition. 15000 to 16000 milliliters per minute in standard condition, and 68000 to 83500 milliliters per minute in standard condition, respectively. The silicon tetrafluoride, the ammonia and the nitrogen for the second insulating thin film layer 42 are 5500 milliliters per minute in standard condition, 30000 milliliters per minute in standard condition, and 80000 milliliters per minute in standard condition, respectively. The silicon tetrafluoride, the ammonia and the nitrogen for the third insulating thin film layer 43 are 7000 to 7200 milliliters per minute in standard condition, 26000 to 27000 milliliters per minute in standard condition, and 66000 to 70000 milliliters per minute in standard condition, respectively. The pressure applied to the first insulating thin film layer 41 is 1200 to 1400 mTorr, the pressure applied to the second insulating thin film layer 42 is 1550 mTorr, and the pressure applied to the third insulating thin film layer 43 is 1400 to 1500 mTorr. The thin film is formed by chemical vapor deposition at a preset temperature of 340° C. or 360° C.

Wherein, the thickness of the insulating layer 40 can be 4500 Ångstrom, the thickness of the first insulating thin film layer 41 is 500 Ångstrom, the thickness of the second insulating thin film layer 42 is 2000 Ångstrom, and the thickness of the third insulating thin film layer 43 is 2000 Ångstrom. The thickness of the first amorphous silicon thin film layer 51 is 1000 Ångstrom, the thickness of the second amorphous silicon thin film layer 52 is 300 Ångstrom. When the chemical vapor deposition is carried out, the silicon tetrafluoride, the ammonia and the nitrogen for the first insulating thin film layer 41 are 2300 milliliters per minute in standard condition, 16000 milliliters per minute in standard condition, and 70000 milliliters per minute in standard condition, respectively. The silicon tetrafluoride, the ammonia and the nitrogen for the second insulating thin film layer 42 are 5500 milliliters per minute in standard condition, 30000 milliliters per minute in standard condition, and 80000 milliliters per minute in standard condition, respectively. The silicon tetrafluoride, the ammonia and the nitrogen for the third insulating thin film layer 43 are 7000 milliliters per minute in standard condition, 27000 milliliters per minute in standard condition, and 70000 milliliters per minute in standard condition, respectively. The pressure applied to the first insulating thin film layer 41 is 1200 mTorr, the pressure applied to the second insulating thin film layer 42 is 1550 mTorr, and the pressure applied to the third insulating thin film layer 43 is 1500 mTorr. The thin film is formed by chemical vapor deposition at a preset temperature of 340° C. or 360° C.

A protective layer 70 and a pixel electrode layer 80 is also included in FIG. 1, and protective layers 70 are included in FIGS. 2-4.

Figure 5:
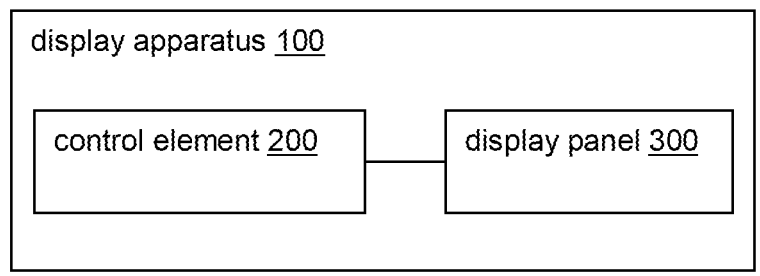
FIG. 5 is a schematic view of a display apparatus according to an embodiment of the present application.

In the above embodiment, the display panel includes a liquid crystal panel, an OLED (Organic Light-Emitting Diode) panel, a QLED (Quantum Dot Light Emitting Diodes) panel, a plasma panel, a planar panel, a curved panel, and the like. Referring to FIG. 5, the present embodiment discloses a display apparatus 100. The display apparatus 100 includes a control element 200 and the display panel 300 described in the present application. The description above is taken the display panel as an example for detail illustration, it should be noted that, the description above to the display panel structure is also applicable to the display apparatus of the embodiment of the present application. Wherein when the display apparatus of the embodiment of the present application is a liquid crystal display, the liquid crystal display includes a backlight module, the backlight module can be used as a light source for supplying a sufficient light source with uniform brightness and distribution, and the backlight module of the present embodiment can also be possible to provide a front-type backlight, and it can be a back-type backlight, it is to be noted that, the backlight module of the present embodiment is not limited thereto.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A display panel, comprising
a substrate, comprising a plurality of pixel regions;
a plurality of active switches disposed on the substrate, wherein the pixel regions are disposed on the active switches, the active switches are corresponding to each of the pixel regions, respectively, and each of the active switch comprises: an insulating layer comprising at least two thin film layers, the at least two thin film layers are formed by chemical vapor deposition process with a predetermined thickness;
wherein each of the active switch comprises a gate electrode layer disposed on the substrate, the insulating layer is disposed on the gate electrode layer,
wherein an amorphous silicon layer is disposed on the insulating layer, the amorphous silicon layer comprises two thin film layers respectively being a first amorphous silicon thin film layer and a second amorphous silicon thin film layer, the second amorphous silicon thin film layer is disposed immediately in contact with the insulating layer and the first amorphous silicon thin film layer is arranged on the second amorphous silicon thin film layer and a thickness of the first amorphous silicon thin film layer is larger than a thickness of the second amorphous silicon thin film layer.

2. The display panel according to claim 1,
wherein the thickness of the first amorphous silicon thin film layer is 1000 Ångstrom, and the thickness of the second amorphous silicon thin film layer is 300 Ångstrom.

3. The display panel according to claim 1, the at least two thin film layers comprise a first insulating thin film layer and a second insulating thin film layer, the first insulating thin film layer and the second insulating thin film layer are arranged successively, the second insulating thin film layer is disposed immediately in contact with the gate electrode layer and the first insulating thin film layer is arranged on the second insulating thin film, the second amorphous silicon thin film layer is disposed immediately in contact with the first insulating thin film layer; and wherein a thickness of the insulating layer is 3500 to 4000 Ångstrom, a thickness of the first insulating thin film layer is 500 to 2000 Ångstrom, and a thickness of the second insulating thin film layer is 2000 to 3500 Ångstrom.

4. The display panel according to claim 3, wherein the thickness of the first amorphous silicon thin film layer is 1000 Ångstrom, and the thickness of the second amorphous silicon thin film layer is 300 Ångstrom.

5. The display panel according to claim 4, wherein an ohmic contact layer is disposed on the first amorphous silicon thin film layer and is disposed immediately contact with the first amorphous silicon thin film layer, two terminals of the ohmic contact layer are provided with a separated source electrode layer and a drain electrode layer of each of the active switch, a channel is provided between the source electrode layer and the drain electrode layer, the channel passes through the ohmic contact layer, and a bottom of the channel is the first amorphous silicon thin film layer.

6. The display panel according to claim 1, the at least two thin film layers comprise a first insulating thin film layer, a second insulating thin film layer, and a third insulating thin film layer, the first insulating thin film layer, the second insulating thin film layer and the third insulating thin film layer are arranged successively, the third insulating thin film layer is disposed immediately in contact with the gate electrode layer, and the second insulating thin film layer is arranged between the third insulating thin film and the first insulating thin film layer; the second amorphous silicon thin film layer is disposed immediately in contact with the first insulating thin film layer; and
wherein a thickness of the insulating layer is 3500 to 4000 Ångstrom, a thickness of the first insulating thin film layer is 500 to 2000 Ångstrom, a thickness of the second insulating thin film layer is 1000 to 3000 Ångstrom, a thickness of the third insulating thin film layer is 500 to 2000 Ångstrom.

7. The display panel according to claim 6,
wherein the thickness of the first amorphous silicon thin film layer is 1000 Ångstrom, and the thickness of the second amorphous silicon thin film layer is 300 Ångstrom;
wherein when performing the chemical vapor deposition, a silicon tetrafluoride, an ammonia and a nitrogen for the first insulating thin film layer are 2300 to 2530 milliliters per minute in standard condition, 15000 to 16000 milliliters per minute in standard condition, and 68000 to 83500 milliliters per minute in standard condition, respectively, the silicon tetrafluoride, the ammonia and the nitrogen for the second insulating thin film layer are 5500 milliliters per minute in standard condition, 30000 milliliters per minute in standard condition, and 80000 milliliters per minute in standard condition, respectively, and the silicon tetrafluoride, the ammonia and the nitrogen for the third insulating thin film layer are 7000 to 7200 milliliters per minute in standard condition, 26000 to 27000 milliliters per minute in standard condition, and 66000 to 70000 milliliters per minute in standard condition, respectively;
wherein a pressure applied to the first insulating thin film layer is 1200 to 1400 mTorr, the pressure applied to the second insulating thin film layer is 1550 mTorr, and the pressure applied to the third insulating thin film layer is 1400 to 1500 mTorr; and
wherein the at least two thin film layers of the insulating layer are formed by the chemical vapor deposition at a preset temperature, the temperature adapted being 340° C. or 360° C.

8. The display panel according to claim 6, wherein when performing the chemical vapor deposition, a silicon tetrafluoride, an ammonia and a nitrogen for the first insulating thin film layer are 2300 to 2530 milliliters per minute in standard condition, 15000 to 16000 milliliters per minute in standard condition, and 68000 to 83500 milliliters per minute in standard condition, respectively;

the silicon tetrafluoride, the ammonia and the nitrogen for the second insulating thin film layer are 5500 milliliters per minute in standard condition, 30000 milliliters per minute in standard condition, and 80000 milliliters per minute in standard condition, respectively; and the silicon tetrafluoride, the ammonia and the nitrogen for the third insulating thin film layer are 7000 to 7200 milliliters per minute in standard condition, 26000 to 27000 milliliters per minute in standard condition, and 66000 to 70000 milliliters per minute in standard condition, respectively.

9. The display panel according to claim 6, wherein an ohmic contact layer is disposed on the first amorphous silicon thin film layer and is disposed immediately contact with the first amorphous silicon thin film layer, two terminals of the ohmic contact layer are provided with a separated source electrode layer and a drain electrode layer of each of the active switch, a channel is provided between the source electrode layer and the drain electrode layer, the channel passes through the ohmic contact layer, and a bottom of the channel is the first amorphous silicon thin film layer.

10. The display panel according to claim 6, wherein a pressure applied to the first insulating thin film layer is 1200 to 1400 mTorr, the pressure applied to the second insulating thin film layer is 1550 mTorr, and the pressure applied to the third insulating thin film layer is 1400 to 1500 mTorr.

11. The display panel according to claim 6, wherein the at least two thin film layers of the insulating layer are formed by the chemical vapor deposition at a preset temperature, the temperature adapted being 340° C. or 360° C.

12. The display panel according to claim 6, wherein the thickness of the first amorphous silicon thin film layer is 1000 Ångstrom, and the thickness of the second amorphous silicon thin film layer is 300 Ångstrom.

13. A display apparatus, comprising:
a control element; and
a display panel, wherein the display panel comprises: a substrate, the substrate comprises a plurality of pixel regions; and
a plurality of active switches disposed on the substrate, wherein the pixel regions are disposed on the active switches, the active switches are corresponding to each of the pixel regions, respectively, and each of the active switch comprises: an insulating layer comprising at least two thin film layers, the at least two thin film layers are formed by chemical vapor deposition process with a predetermined thickness;
wherein each of the active switch comprises a gate electrode layer disposed on the substrate, the insulating layer is disposed on the gate electrode layer,
wherein an amorphous silicon layer is disposed on the insulating layer, the amorphous silicon layer comprises two thin film layers respectively being a first amorphous silicon thin film layer and a second amorphous silicon thin film layer, the second amorphous silicon thin film layer is disposed immediately in contact with the insulating layer and the first amorphous silicon thin film layer is arranged on the second amorphous silicon thin film layer and a thickness of the first amorphous silicon thin film layer is larger than a thickness of the second amorphous silicon thin film layer.

14. The display apparatus according to claim 13, wherein the thickness of the first amorphous silicon thin film layer is 1000 Ångstrom, and the thickness of the second amorphous silicon thin film layer is 300 Ångstrom;

wherein when performing the chemical vapor deposition, a silicon tetrafluoride, an ammonia and a nitrogen for the first insulating thin film layer are 2300 to 2530 milliliters per minute in standard condition, 15000 to 16000 milliliters per minute in standard condition, and 68000 to 83500 milliliters per minute in standard condition, respectively, the silicon tetrafluoride, the ammonia and the nitrogen for the second insulating thin film layer are 5500 milliliters per minute in standard condition, 30000 milliliters per minute in standard condition, and 80000 milliliters per minute in standard condition, respectively, the silicon tetrafluoride, the ammonia and the nitrogen for the third insulating thin film layer are 7000 to 7200 milliliters per minute in standard condition, 26000 to 27000 milliliters per minute in standard condition, and 66000 to 70000 milliliters per minute in standard condition, respectively;

wherein a pressure applied to the first insulating thin film layer is 1200 to 1400 mTorr, the pressure applied to the second insulating thin film layer is 1550 mTorr, and the pressure applied to the third insulating thin film layer is 1400 to 1500 mTorr; and the at least two thin film layers of the insulating layer formed by the chemical vapor deposition at a preset temperature, the temperature adapted being 340° C. or 360° C.

15. A display panel, comprising
a substrate, comprising a plurality of pixel regions;
a plurality of active switches disposed on the substrate, wherein the pixel regions are disposed on the active switches, the active switches are corresponding to each of the pixel regions, respectively, and each of the active switch comprises: an insulating layer comprising at least two thin film layers, the at least two thin film layers are formed by chemical vapor deposition process with a predetermined thickness;
wherein each of the active switch comprises a gate electrode layer disposed on the substrate, the insulating layer is disposed on the gate electrode layer,
wherein an amorphous silicon layer is disposed on the insulating layer, the amorphous silicon layer comprises two thin film layers respectively being a first amorphous silicon thin film layer and a second amorphous silicon thin film layer, the second amorphous silicon thin film layer is disposed immediately in contact with the insulating layer, the first amorphous silicon thin film layer is arranged on the second amorphous silicon thin film layer, and a thickness of the first amorphous silicon thin film layer is larger than a thickness of the second amorphous silicon thin film layer;
the at least two thin film layers comprise a first insulating thin film layer, a second insulating thin film layer, and a third insulating thin film layer, the first insulating thin film layer, the second insulating thin film layer and the third insulating thin film layer are arranged successively, the third insulating thin film layer is disposed immediately in contact with the gate electrode layer, and the second insulating thin film layer is arranged between the third insulating thin film and the first insulating thin film layer; the second amorphous silicon thin film layer is disposed immediately in contact with the first insulating thin film layer;

wherein a thickness of the insulating layer is 3500 to 4000 Ångstrom, a thickness of the first insulating thin film layer is 500 to 2000 Ångstrom, a thickness of the second insulating thin film layer is 1000 to 3000 Ångstrom, and a thickness of the third insulating thin film layer is 500 to 2000 Ångstrom;

wherein when performing the chemical vapor deposition, a silicon tetrafluoride, an ammonia and a nitrogen for the first insulating thin film layer are 2300 to 2530 milliliters per minute in standard condition, 15000 to 16000 milliliters per minute in standard condition, and 68000 to 83500 milliliters per minute in standard condition, respectively, the silicon tetrafluoride, the ammonia and the nitrogen for the second insulating thin film layer are 5500 milliliters per minute in standard condition, 30000 milliliters per minute in standard condition, and 80000 milliliters per minute in standard condition, respectively, the silicon tetrafluoride, the ammonia and the nitrogen for the third insulating thin film layer are 7000 to 7200 milliliters per minute in standard condition, 26000 to 27000 milliliters per minute in standard condition, and 66000 to 70000 milliliters per minute in standard condition, respectively;

wherein a pressure applied to the first insulating thin film layer is 1200 to 1400 mTorr, the pressure applied to the second insulating thin film layer is 1550 mTorr, and the pressure applied to the third insulating thin film layer is 1400 to 1500 mTorr; and the at least two thin film layers of the insulating layer formed by the chemical vapor deposition at a preset temperature, the temperature adapted being 340° C. or 360° C.

* * * * *